United States Patent
Nguyen Hoang et al.

(10) Patent No.: US 8,012,872 B2
(45) Date of Patent: Sep. 6, 2011

(54) PLANARISING DAMASCENE STRUCTURES

(75) Inventors: Viet Nguyen Hoang, Leuven (BE);
Greja J. A. M. Verheijden, Valkenswaard (NL)

(73) Assignee: NXP B.V., Eindhoven (NL)

( * ) Notice: Subject to any disclaimer, the term of this patent is extended or adjusted under 35 U.S.C. 154(b) by 892 days.

(21) Appl. No.: 11/718,876

(22) PCT Filed: Nov. 2, 2005

(86) PCT No.: PCT/IB2005/053568
§ 371 (c)(1),
(2), (4) Date: Jan. 28, 2008

(87) PCT Pub. No.: WO2006/048823
PCT Pub. Date: May 11, 2006

(65) Prior Publication Data
US 2011/0147944 A1 Jun. 23, 2011

(30) Foreign Application Priority Data
Nov. 8, 2004 (EP) .................................... 04105575

(51) Int. Cl.
*H01L 21/4763* (2006.01)
(52) U.S. Cl. ............... 438/643; 257/751; 257/E21.585; 438/622
(58) Field of Classification Search ............... 257/751, 257/752, E21.576, E21.577, E21.584, E21.585; 438/653, 654, 687, 622, 626–629, 637, 643, 438/645
See application file for complete search history.

(56) References Cited

U.S. PATENT DOCUMENTS

| 5,824,599 | A | * | 10/1998 | Schacham-Diamand et al. | 438/678 |
| 6,150,260 | A | | 11/2000 | Roy | |
| 6,221,775 | B1 | | 4/2001 | Ference et al. | |
| 6,274,483 | B1 | * | 8/2001 | Chang et al. | 438/640 |
| 6,274,485 | B1 | | 8/2001 | Chen et al. | |
| 6,372,632 | B1 | | 4/2002 | Yu et al. | |
| 6,376,376 | B1 | | 4/2002 | Lim et al. | |
| 2003/0082296 | A1 | | 5/2003 | Elers et al. | |
| 2004/0058526 | A1 | | 3/2004 | Cowley et al. | |

FOREIGN PATENT DOCUMENTS
EP  20021171784  1/2002
GB  20022365215  2/2002

OTHER PUBLICATIONS

"Chemical Mechanical Planarisation of Microelectronic Materials" J.M. Steigerwald, S.P. Murarka, R.J. Gutman; John Wiley & Sons New York, 1997.
"Atomic Layer Depostion of Metal and Nitrid Thin Films" H. Kim, Jour Vacuum Science & Technology B: Microelectronics and Nanometer Structures, vol. 21 No. 6 p. 2231 (2003).

* cited by examiner

Primary Examiner — David Vu

(57) ABSTRACT

Manufacturing a damascene structure involves: forming a sacrificial layer (20) on a substrate (10) to protect an area around a recess (30) for the damascene structure, forming a barrier layer (40) in the recess, and in electrical contact with the sacrificial layer, forming the damascene structure (50) in the recess, and planarizing. During the planarizing the sacrificial layer reacts electrochemically with the barrier layer or with the damascene structure. This can alter a relative rate of removal of the damascene structure and the sacrificial layer so as to reduce dishing or protrusion of the damascene structure, and reduce copper residues, and reduce barrier corrosion. The barrier layer can be formed by ALCVD. The barrier material being one or more of WCN and TaN. The sacrificial layer can be TaN, TiN or W.

14 Claims, 4 Drawing Sheets

Copper deposition

Dielectric deposition

Sacrificial material deposition

Patterning

Barrier deposition

Copper deposition

CMP

PLANARISING DAMASCENE STRUCTURES

This invention relates to a method for making damascene structures, for applications such as integrated semiconductor devices as well as semiconductor devices made in accordance with the method.

Currently, damascene interconnect structures are manufactured by CMP (chemical mechanical polishing or planarising). The CMP process has been comprehensively described and illustrated by J. M. Steigerwald, S. P. Murarka and R. J. Gutman in 'Chemical Mechanical Planarisation of Microelectronic Materials', John Wiley & Sons, New York, 1997. A CMP process comprises moving a sample surface to be planarised or polished against a polishing pad that is used to provide support against the sample surface and to carry slurry between the sample surface and the polishing pad to affect polishing which leads to planarisation. CMP is carried out with a liquid slurry.

Damascene structures are those which are inlaid into a surface of an existing layer, i.e. inlaid into a recess or trench. Often a barrier layer is needed to prevent diffusion of the metal of the structure, e.g. copper, or to aid adhesion of the metal, e.g. copper. One problem associated with CMP is the dishing of the inlaid metal lines. Dishing means the surface of a metal line becomes concave. This can reduce the thickness of metal interconnects leading to an increase in the interconnect resistance and a decrease in the interconnect lifetime. In addition, the undesirable uneven topography on the wafer surface can cause problems for subsequent processing steps.

To avoid dishing, special polishing slurries (hereafter referred to as low-dishing slurries) are developed and excellent results in terms of dishing performance have been obtained, which are superior to conventional CMP. However, one disadvantage of a CMP process using low-dishing slurry is that metal, e.g. copper residues remain on the wafer surface and are very difficult to remove. This poses a serious risk of a short circuit.

An explanation for the good dishing performance of the CMP process using low-dishing slurry and copper is the electro-chemical interaction between copper and the barrier material. When both copper and the barrier material are exposed to the polishing solution (at the end of the copper CMP process), they form a galvanic couple in which copper is the cathode. This stops the corrosion of copper and therefore protects the damascene copper structure from dishing. However, stopping removal of copper when it is exposed concurrently with barrier material also means that the copper, which remains on the surface, is harder to remove. As a result, there are copper residues. Another drawback of the CMP process using low-dishing slurry is that while copper corrosion is stopped, barrier corrosion can be promoted.

It is also known to provide a barrier layer for copper features using ALCVD (Atomic layer chemical vapor deposition). This is particularly useful for producing good thin conformal barriers of WCN or TaN. WCN is preferred as having better barrier properties for a given thickness. However, it is difficult to manufacture because WCN is a chemically active barrier, so during CMP the WCN etches faster than the copper. The result is copper protrusion which again can cause problems for subsequent layers. Also, undesirable corrosion of a WCN barrier can occur during CMP.

It is known from U.S. Pat. No. 6,150,260 that a sacrificial TiN layer can be deposited over the oxide to protect the oxide and to act as an endpoint detector. It is known from U.S. Pat. No. 6,274,485 that a sacrificial high polish rate layer of TiN can be used over an oxide layer but under a barrier layer, and tungsten layer to prevent dishing. It is known from U.S. Pat. No. 6,376,376 that dishing can be a problem where the barrier is harder and chemically more stable than the copper in the damascene structure, such as where the barrier is TaN. Rather than three different CMP steps with three different slurries, this document proposes two such steps, the first leaving dishing, the second leaving the copper protruding. This protrusion can then be reduced by an overpolish. This needs several protective layers, including a hard layer of TaN which is removed more slowly than the copper in the first step, and a oxide layer which is removed by the second step, which uses an oxide slurry to remove the oxide faster than the copper. A polish stop layer is deposited under the oxide layer.

It is known from U.S. Pat. No. 6,221,775 to use a hard layer of Ti/TiN or TaN/Ta, as a polish stop for a CMP step. An RIE step is then used to remove residuals and other debris. A barrier layer within the damascene recess or trench can be Ti/TiN or TaN/Ta. It is known from U.S. Pat. No. 6,372,632 to form a sacrificial oxide layer beneath a barrier layer.

An object of the invention is to provide improved methods to manufacture damascene structures for applications such as integrated semiconductor devices as well as semiconductor devices made in accordance with the methods.

According to a first aspect, the invention provides a method of manufacturing a damascene structure in a substrate having the steps of: (1) depositing a conductive sacrificial layer, e.g. a metallic sacrificial layer, on the substrate, (2) etching a trench or recess through the sacrificial layer into the substrate, (3) depositing a barrier layer covering the surface between sidewall and bottom of the trench or recess and in electrical contact with the sacrificial layer, (4) depositing a conducting layer, e.g. a metal layer such as copper or tungsten, and overfilling the trench or recess, and (5) removal and/or planarising of the conducting metal layer to make a damascene structure, the materials of the sacrificial layer and the barrier layer being chosen so that during planarising the sacrificial layer reacts electrochemically with the barrier layer or with the damascene structure.

According to another aspect, the invention provides a method of manufacturing a damascene structure in a substrate, having the steps of: forming a sacrificial layer on the substrate to protect an area around a recess or trench for the damascene structure, forming a barrier layer in the recess or trench and in electrical contact with the sacrificial layer, forming the damascene structure in the recess or trench, and a step of planarising the damascene structure, the materials of the sacrificial layer and the barrier being chosen so that during the planarising the sacrificial layer reacts electrochemically with the barrier layer or with the damascene structure.

This method contrasts with the above mentioned prior art method which rely essentially on mechanical removal to achieve planarisation. The electrochemical reaction during planarisation can have a number of advantages. It can alter a relative rate of removal of the damascene structure and the sacrificial layer so as to reduce undesirable dishing or protrusion of the damascene structure. It can also help reduce an amount of undesirable metal, e.g. copper residues. The electrochemical reaction can also reduce barrier corrosion.

It is preferred in accordance with the present invention if the sacrificial material and the barrier material are chosen to reduce corrosion. When a metal, such as copper, and a barrier material are together in a CMP solution, an electrochemical cell is formed with the metal, e.g. copper, in most cases being a cathode. This means metals ions, e.g. copper ions in the solution will scavenge electrons from the barrier and be transformed into metal, e.g. Cu metal which will re-deposit back to the wafer surface. In the mean time, the barrier, by giving away electrons, becomes corroded. This deposition and/or corrosion depend on the difference in potential between the metal, e.g. Cu, and the barrier in a particular solution and the ratio between surface area of metal, e.g. copper and barrier in contact with the solution. To prevent this happening or to reduce or minimize it, the present invention proposes to introduce a sacrificial conductive layer, such as a sacrificial metal layer in between the barrier and the metal such as copper. This sacrificial material moderates the removal of metal, e.g. copper, and barrier material and provides galvanic protection.

It is not always necessary to remove all the sacrificial layer during the planarising, in other words, it is intended that the present invention encompasses semi-sacrificial layers.

An additional feature of the present invention is the sacrificial layer and barrier layer being different metallic materials. The conductivity of such materials and the use of different materials tends to assist the electrochemical reaction.

Another such additional feature is the forming of the barrier layer comprising an ALCVD step. This is an important step for enabling smaller device dimensions or increased device performance, but has associated technical problems. Hence it is potentially commercially valuable to be able to reduce these problems using the sacrificial layer and electrochemical reactions.

Another such additional feature is the barrier material being one or more of WCN and TaN. These are currently favored materials for their good barrier properties. Also, they can be formed using ALCVD.

Another such additional feature is the materials being one of the following combinations: a TaN sacrificial layer with a WCN barrier layer, a TiN sacrificial layer with a WCN barrier layer, a W sacrificial layer with a WCN barrier layer, a W sacrificial layer with a TaN barrier layer, an Al sacrificial layer with a WCN barrier layer, an Al sacrificial layer with a TaN barrier layer.

Another such additional feature is the damascene structure being formed from a metallic material, and the substrate comprising a dielectric.

Another such additional feature is the damascene structure being formed from a metallic material, and the sacrificial layer being formed of a material having a polish rate lower than that of the damascene structure. This can help minimize protrusion and dishing. Another such additional feature is the recess being formed by a patterning step after the step of forming the sacrificial layer.

Another such additional feature is the planarisation comprising a slurry polishing step such as CMP which comprises overpolishing.

Another aspect provides a method of manufacturing an integrated circuit comprising the above method of manufacturing a damascene structure as part of the integrated circuit, and a step of forming one or more further layers on the planarised surface.

Another aspect of the invention provides a method of forming a damascene structure in a substrate having the steps of: (1) depositing a sacrificial layer, such as a metallic sacrificial layer on the substrate, (2) etching trenches or recesses through the sacrificial layer into the substrate, (3) depositing a barrier layer using an ALCVD process covering the surface between, sidewall and bottom of the trenches or recesses and in electrical contact with the sacrificial layer, (4) depositing a conducting layer, e.g. a metal such as copper, tungsten, and overfilling the trenches or recesses, (5) and using a polishing technique such as CMP to planarise the damascene structure.

Another aspect of the invention provides a method of forming a damascene structure in a substrate, having the steps of: forming a sacrificial layer on the substrate to protect an area around a recess or trench for the damascene structure, using an ALCVD process to form a barrier layer in the recess or trench and in electrical contact with the sacrificial layer, forming the damascene structure in the recess or trench, and using a polishing process such as CMP to planarise the damascene structure.

The combination of a sacrificial layer and ALCVD helps enable some of the technical drawbacks of ALCVD to be overcome.

Another such additional feature is the barrier material being one or more of WCN and TaN. These are currently favored materials for their good barrier properties.

Another such additional feature is the materials being one of the following combinations: a TaN sacrificial layer with a WCN barrier layer, a TiN sacrificial layer with a WCN barrier layer, a W sacrificial layer with a WCN barrier layer, a W sacrificial layer with a TaN barrier layer, an Al sacrificial layer with a WCN barrier layer, an Al sacrificial layer with a TaN as barrier layer.

Another aspect is an integrated circuit manufactured using any of the methods set out above.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

How the present invention may be put into effect will now be described by way of example with reference to the appended drawings, in which:

FIGS. 1 to 6 show steps of a manufacturing process according to an embodiment, FIGS. 7, 8, 10 and 11 show graphs of topographies of surfaces planarised according to known principles, and FIGS. 9 and 12 show graphs of topographies of surfaces planarised according to embodiments of the invention.

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

The embodiments of the invention described below are concerned with making damascene structures such as a conductive interconnect, e.g. a metal interconnect, by stacking a conductive sacrificial layer and a conductive barrier layer for reducing dishing during a polishing step, e.g. a slurry polishing step such as CMP, while counteracting the issue of unwanted metal, e.g. copper residues. A principle behind this improvement is the electrochemical reaction between the metal, e.g. copper, the sacrificial material and the barrier material. This electrochemical reaction can also reduce barrier corrosion, i.e. provide galvanic protection. It is preferred in accordance with the present invention if the sacrificial material and the barrier material are chosen to reduce corrosion. When a metal, such as copper, and a barrier material are together in contact with a slurry, e.g. CMP solution, an electrochemical cell is formed with the metal, e.g. copper, in most cases being a cathode. This means metal ions, e.g. copper ions in the solution will scavenge electrons from the barrier and be transformed into metal, e.g. Cu metal which will re-deposit back to the wafer surface. In the mean time, the barrier, by giving away electrons, becomes corroded. This deposition and/or corrosion depends on the difference in potential between the metal, e.g. Cu and the barrier in a particular solution and the ratio between surface area of metal, e.g. copper and barrier in contact with the solution. To prevent this happening or to reduce or minimize it, the present invention proposes to introduce a sacrificial conductive layer, such as a metal layer in between the barrier and the metal, e.g. copper, which is to form the interconnect. This sacrificial material moderates the removal of metal, e.g. copper, and barrier material and provides galvanic protection.

The sacrificial layer and the conductive layer are preferably of different materials. Preferred sacrificial materials are: TiN, TaN, W, Al and other semiconductor compatible metals and metallic compounds. Preferred barrier materials are: TiN, TaN, Ta, WCN or any combination thereof. These materials are preferred materials for two important points: first and foremost they are IC process compatible and secondly, their integration ability into the IC manufacturing process has been proven.

Exemplary combinations are:
1. TaN sacrificial layer+WCN barrier layer
2. TiN sacrificial layer+WCN barrier layer
3. W sacrificial layer+WCN barrier layer
4. W sacrificial layer+TaN barrier layer
5. Al sacrificial layer+WCN barrier layer
6. Al sacrificial layer TaN barrier layer.

The barrier layer and the sacrificial layer should be in electrical contact with each other, to facilitate the electron exchange and hence the electrochemical reaction.

FIG. 1 shows a first step in a manufacturing process for making a damascene structure according to an embodiment of the present invention. This step involves application or deposition of a substrate in the form of a dielectric layer 10 for example.

In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or an $Si_3N_4$ layer in addition to a semiconductor substrate portion. Thus, the term substrate also includes glass, plastic, ceramic, silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer. Hence, this substrate layer can be any material which is suitable for inlaying a damascene structure, including an oxide layer such as silicon dioxide or TEOS for example. It can be formed on top of other underlying layers, including substrates and semiconductor or conductive layers.

Examples for dielectric layer are: $SiO_2$, Black Diamond™, Orion™, Aurora™, Silk™, p-Silk™ and other low-dielectric constant materials being investigated or in used in IC manufacturing process. The dielectric layer can be made from one dielectric material or a combination of multiple layers of different dielectric materials.

FIG. 2 shows how a sacrificial layer 20 has been deposited on the dielectric layer. The sacrificial can be metallic such as a metal layer or a conducting compound containing metal or metals. The "sacrificial" layer in this case is used as a mask for a subsequent etching part of the planarising process, to protect areas around the damascene structure. The sacrificial material can be deposited by any suitable means such as PVD, thermal evaporation, sputtering, CVD, ALCVD or any combination of the above techniques.

FIG. 3 shows the result of a next step of patterning to create recesses 30, e.g. trenches, for the damascene structures. The patterning may be carried out by conventional techniques, e.g. micro lithography using a resist layer. The sacrificial layer remains on the surface around the recesses, e.g. trenches. Hence after patterning the recesses or trenches are bordered by material or the sacrificial layer. FIG. 4 shows the result of the next step, of depositing a barrier layer 40. This covers all the inside surfaces of the recesses, e.g. trenches. That is the sidewalls and bottom of the trenches are covered. The material for the barrier layer 40 is preferably chosen so as to prevent or reduce diffusion of metal or other material of the damascene structure into the substrate during the lifetime of the device. The barrier layer should be as thin as possible to enable feature size to be kept as small as possible, for integrated circuit devices where level of integration is to be maximised. The thickness of a barrier layer can be, for example, between 1 nm up to 50 nm. Currently, a typical thickness is 15-25 nm, but is dependent upon process technology available. The thickness of this barrier layer may be thinned down by using ALCVD. With this method, a conformal layer of thickness of 1 nm up to 15-25 nm can be applied.

The barrier layer may be applied by any suitable method, e.g. PVD, thermal evaporation, sputtering, CVD, ALCVD or any combination of the above techniques. As indicated above ALCVD is advantageous in providing good, thin conformal layers. An explanation of ALCVD process can be found in the article by H. Kim, "Atomic Layer Deposition of Metal and Nitride Thin Films," *Jour. Vacuum Science & Technology B: Microelectronics and Nanometer Structures*, Vol. 21, No. 6, p. 2231 (2003), for example.

The barrier layer may cover the sacrificial layer outside the recesses or trenches, as it is usually difficult to prevent this, and the unwanted parts of the barrier layer can be removed by planarisation in a later step anyway.

FIG. 5 shows the result of the next step, of deposition of the damascene structure 50 into the recesses, e.g. trenches. In the example shown, the material deposited is a metal, e.g. copper, though other materials can be used, such as other metals, including Al, W, Al alloys, for example, depending on the purpose of the damascene structure. The metal, e.g. copper can be deposited by chemical or physical vapor deposition or other methods for example.

FIG. 6 shows the step of planarisation, in this case using a polishing step such as a polishing step, especially a polishing step which makes use of a slurry such as CMP. This removes the unwanted metal, e.g. copper, which is outside the recesses, e.g. trenches, and removes the unwanted parts of the sacrificial layer and the barrier layer outside the recess or trench. Experimental data show a clear improvement of the proposed stack as compared to conventional stack in terms of dishing and metal, e.g. copper residues. In this step, the barrier layer will be etched away rapidly, owing to electrochemical reaction with the metal of the damascene structure. The sacrificial layer is chosen to have a much lower removal rate than the metal of the damascene structure during the relevant planarising process, e.g. CMP. This is partly due to the electrochemical reactions between the materials of these layers. This prevents or reduces protrusion of the damascene structure, and reduces or prevents metal, e.g. copper residues. The polishing, e.g. CMP step can include overpolishing to further remove protrusion or residues.

In summary, a new stack has been described for making damascene structure. This stack consists of a conducting "sacrificial" layer. The sacrificial layer should be able to exchange electrons with the barrier and metal interconnects. Therefore, this layer is not only conducting but preferably a metallic layer or a compound containing metal or metals. The interaction of this layer with metal for the interconnect such as copper during a slurry polishing process such as CMP will help to minimize dishing and metal, e.g. copper residues. It is foreseen that by careful selection of sacrificial material, the issues of barrier corrosion can also be avoided or reduced. This would be very beneficial for any technology where ALCVD deposited barriers, which are susceptible to corrosion, will be applied. An example is aluminium as Al is a very chemical active metal. When it is combined with other metals, the Al will probably be corroded. Provided that a constant abrasion is maintained to avoid forming a continuous layer of $Al_2O_3$ layer protecting Al from further corrosion.

FIGS. 7 to 12 show graphs of scanning profiles of a surface of a 30 μm line/30 μm spacing array at two polishing times and for three different stacks. In every case the first copper structure starts about 50 μm into the scan, and a second copper structure starts at about 115 μm into the scan. FIGS. 7 to 9 show the surface before an overpolishing part of a CMP process, while FIGS. 10 to 12 show the same surfaces after overpolishing. FIGS. 7 and 10 are for a stack using a WCN barrier without a sacrificial layer, for comparison purposes. These figures show that there is a problem with copper residues in particular. The methods used to generate these figure included:

The dielectric material in which metal lines are embedded was $SiO_2$. The sacrificial layer was TaN having a thickness of about 10 nm after patterning. The patterning step can also consume a part of the TaN layer. Hence, the starting thickness of TaN before patterning is preferably greater than the final thickness, e.g. 25 nm. The barrier material was a WCN layer deposited by ALCVD. The thickness was between 5 and 15 nm, e.g. 10 nm. The metal interconnect was copper having a thickness of 100 nm deposited by a PVD method, e.g. sputtering and about 1000 nm deposited by electro-chemical deposition.

The CMP process had two different polish times. A first period till the end point which was triggered by a system which looks at the wafer surface and detects the reflectivity of a laser beam and a second period up to the end-point time plus 50 s. The wafer carrier/platen speed was 120 rpm/70 rpm using a standard slurry. Polishing pressure during the main polishing phase was 1.8 psi.

CONCLUDING REMARKS

Figure 1:
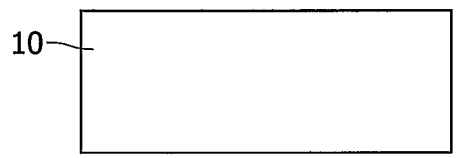
Figure 2:
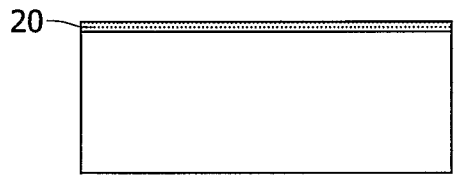
Figure 3:
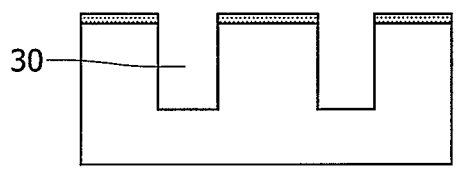
Figure 4:
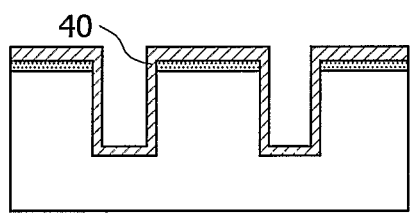
Figure 5:
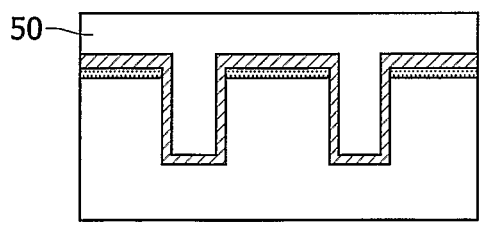
Figure 6:
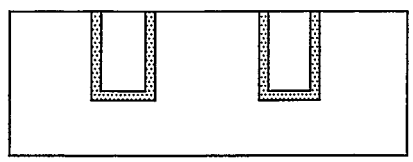
Figure 7:
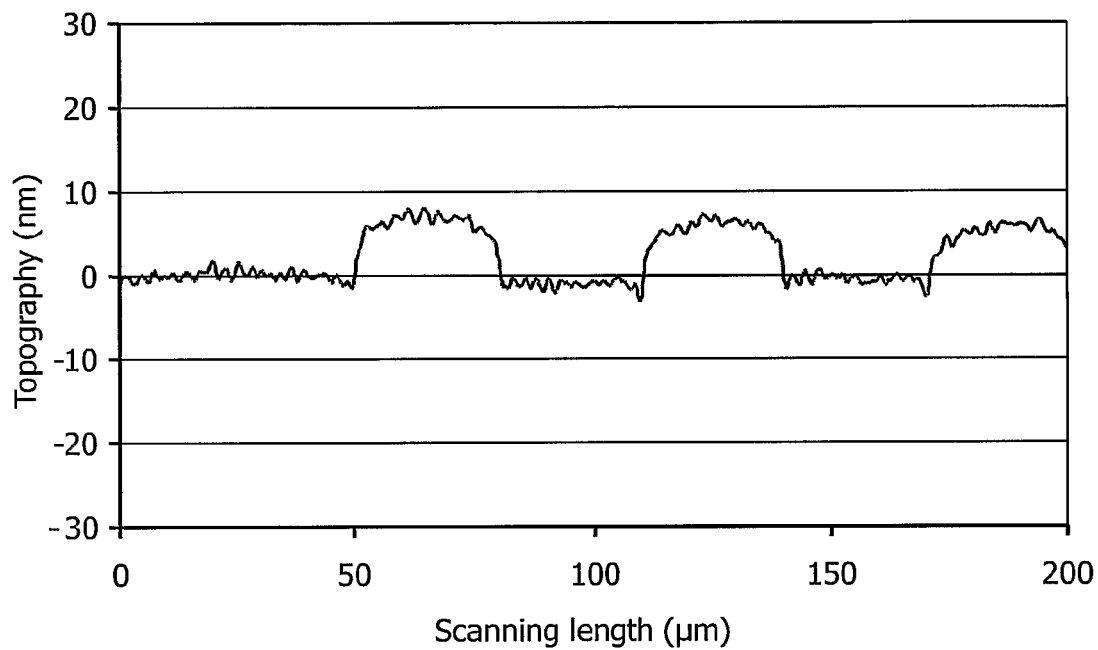
Figure 8:
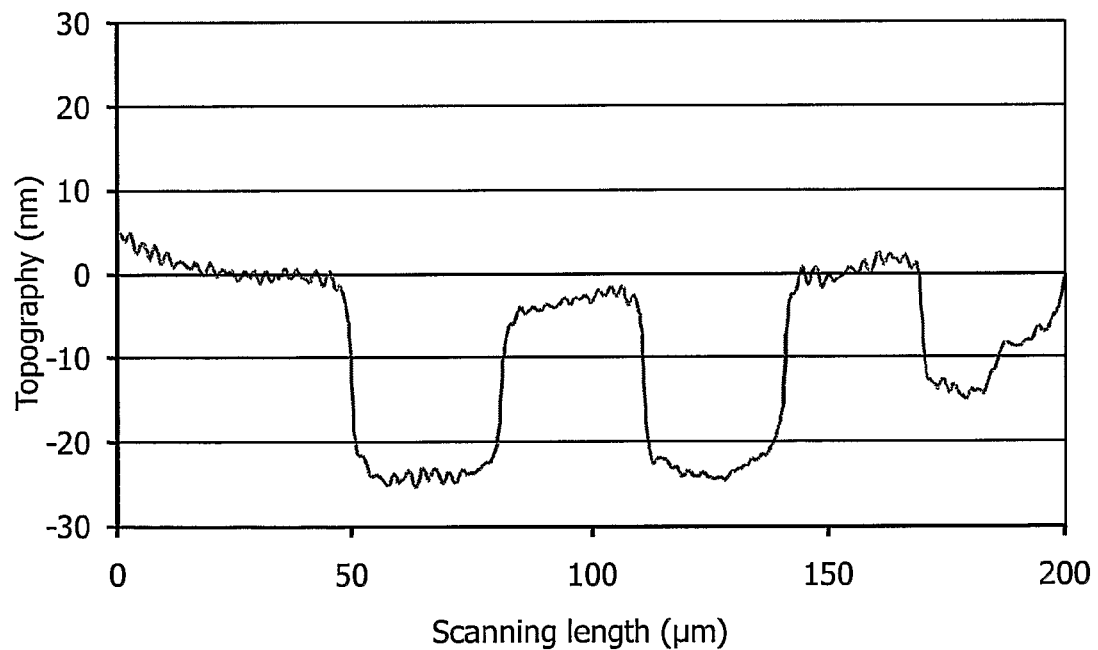
FIGS. 8 and 11 are for a stack with a Ta/TaN barrier, again without the sacrificial layer using electrochemical reaction as described above. In this case, there is considerable dishing.
Figure 9:
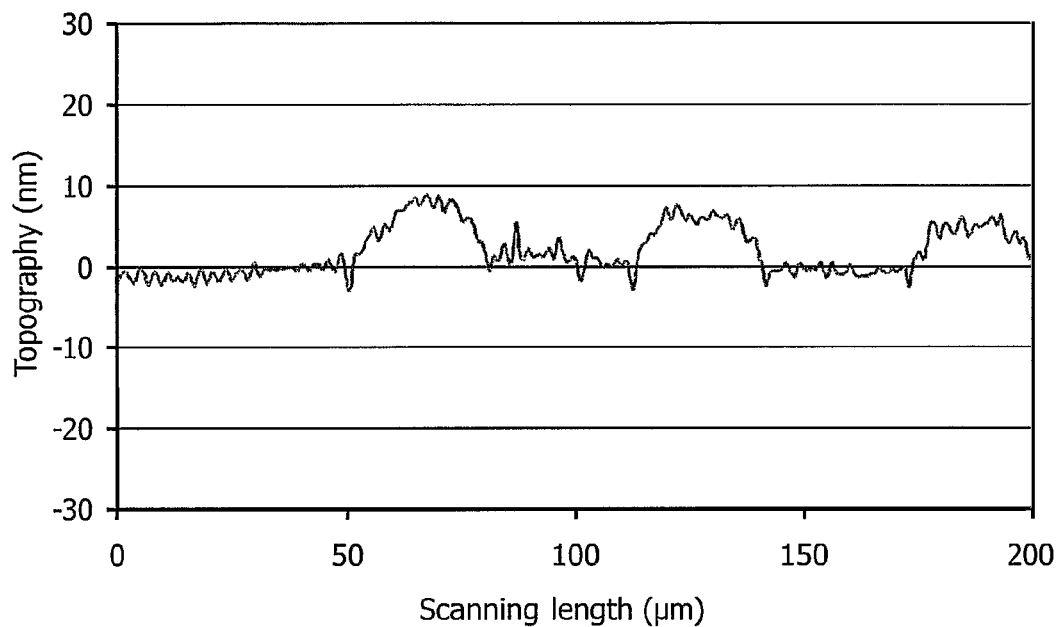
FIGS. 9 and 12 are for the stack of an embodiment of the invention, with a WCN barrier layer and a sacrificial layer of TaN. As shown, this gives a smaller amount of dishing and a cleaner surface with less residue, as shown in FIG. 12.
Figure 10:
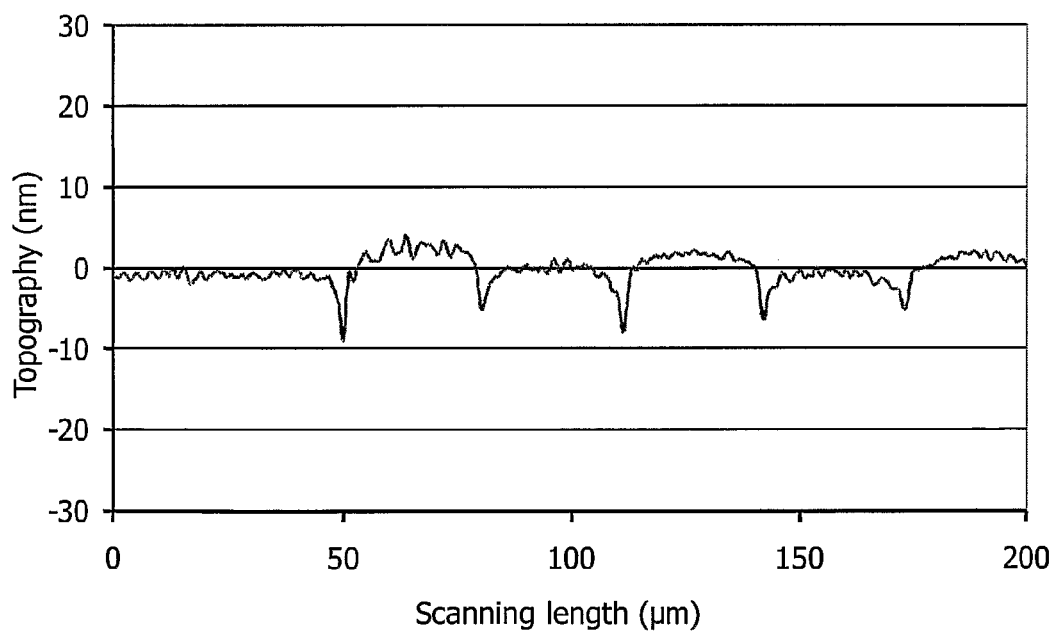
Figure 11:
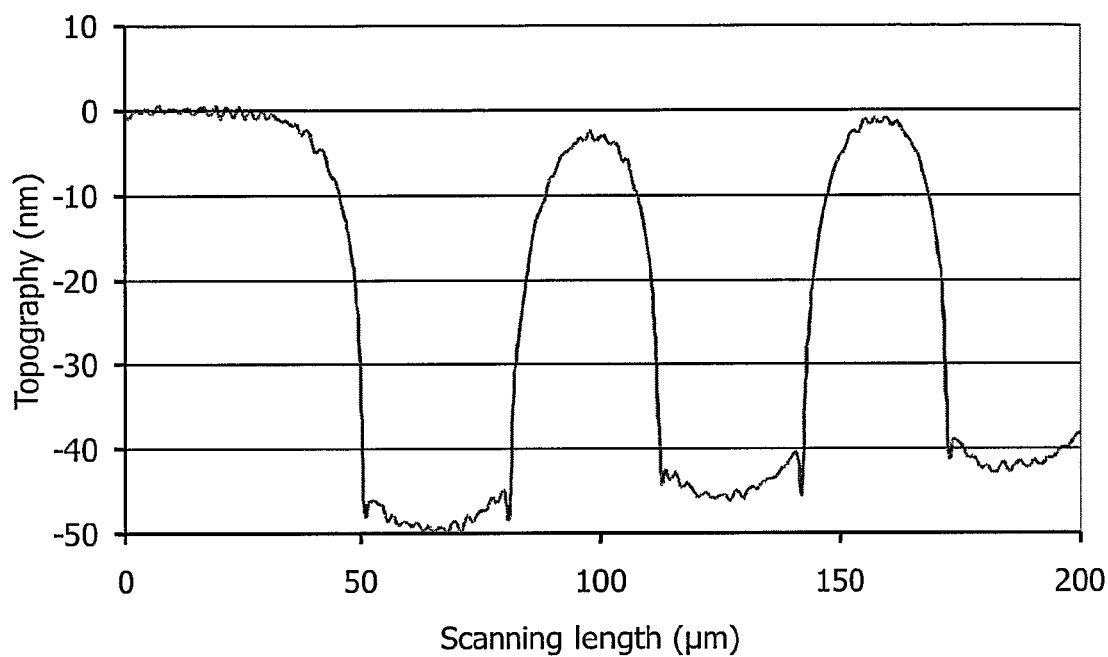
Figure 12:
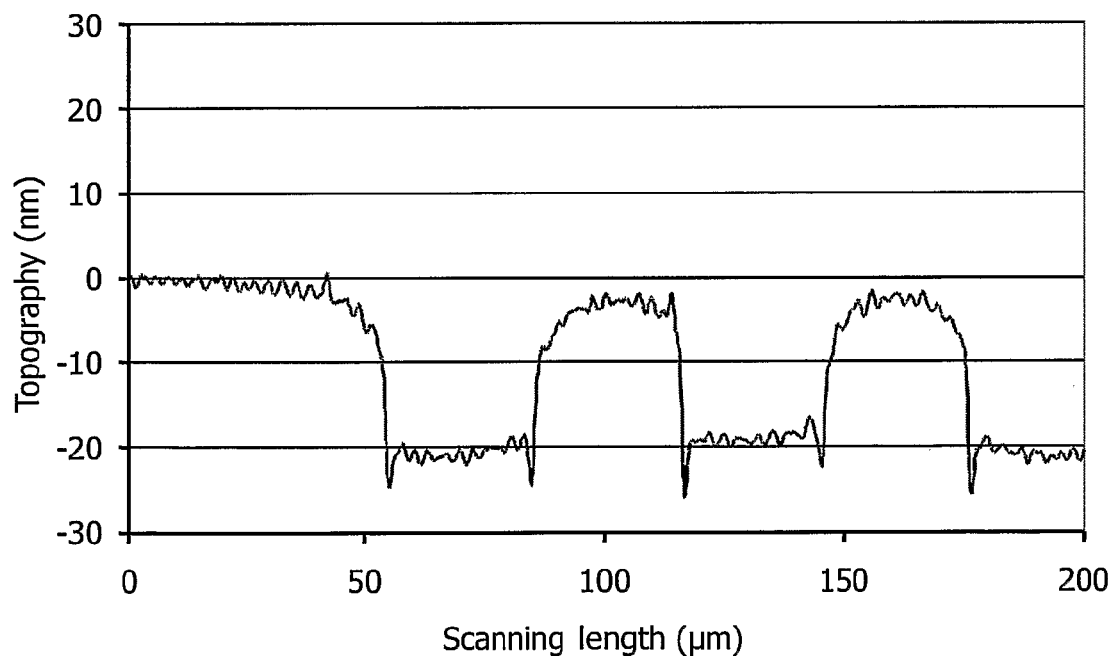

As has been described above, manufacturing a damascene structure involves: forming a sacrificial layer on a substrate to protect an area around a recess or trench for the damascene structure, forming a barrier layer in the recess or trench, and in electrical contact with the sacrificial layer, forming the damascene structure in the recess or trench, and planarising. During the planarising the sacrificial layer reacts electrochemically with the barrier layer or with the damascene structure. This can alter a relative rate of removal of the damascene structure and the sacrificial layer so as to reduce dishing or protrusion of the damascene structure, and reduce metal, e.g. copper residues, and reduce barrier corrosion. The barrier layer can be formed by ALCVD. The barrier material being one or more of WCN and TaN. The sacrificial layer can be TaN, TiN or W.

Other variations can be envisaged and are intended to be encompassed by the claims.

The invention claimed is:

1. A method of manufacturing a damascene structure in a substrate, comprising: depositing a conductive sacrificial layer, on the substrate, etching a trench or recess through the sacrificial layer into the substrate, depositing a barrier layer covering the surface between a sidewall and a bottom of the trench or recess and in electrical contact with the sacrificial layer, depositing a conducting layer and overfilling the trench or recess, and removing or planarising the conducting layer to make a damascene structure, the materials of the sacrificial layer and the barrier layer being chosen so that during the removing or planarising the sacrificial layer reacts electrochemically with the barrier layer or with the damascene structure.

2. The method according to claim 1, wherein the removing or planarising is carried out by a slurry polishing step.

3. The method of claim 2, the damascene structure being formed from a metallic material, and the sacrificial layer being formed of a material having a polish rate lower than that of the damascene structure.

4. The method of claim 1, wherein the forming of the barrier layer is an ALCVD step.

5. The method of claim 1, wherein the sacrificial layer and barrier layer include different metallic materials.

6. The method of claim 5, wherein the barrier material is one or more of WCN and TaN.

7. The method of claim 5, wherein the sacrificial layer and barrier layer are any of:
 a TaN sacrificial layer with a WCN barrier layer,
 a TiN sacrificial layer with a WCN barrier layer,
 a W sacrificial layer with a WCN barrier layer,
 a W sacrificial layer with a TaN barrier layer,
 an Al sacrificial layer with a WCN barrier layer,
 an Al sacrificial layer with a TaN barrier layer.

8. The method of claim 1, the damascene structure being formed from a metallic material, and the substrate (10) comprising a dielectric.

9. The method of claim 1, the trench or recess being formed by a patterning step after the step of forming the sacrificial layer.

10. The method of claim 1, the planarisation comprising CMP including overpolishing.

11. The method of claim 1, wherein the sacrificial layer provides galvanic protection for the barrier layer during removing or planarizing.

12. A method of manufacturing an integrated circuit including, a method of manufacturing a damascene structure in a substrate, comprising: depositing a conductive sacrificial layer, on the substrate, etching a trench or recess through the sacrificial layer into the substrate, depositing a barrier layer covering the surface between a sidewall and a bottom of the trench or recess and in electrical contact with the sacrificial layer, depositing a conducting laser and overfilling the trench or recess, and removing or planarising the conducting layer to make a damascene structure, the materials of the sacrificial layer and the barrier layer being chosen so that during the removing or planarising the sacrificial layer reacts electrochemically with the barrier layer or with the damascene structure; and forming one or more further layers on the planarised surface.

13. The method of claim 12, the barrier layer being formed of WCN or TaN.

14. A semiconductor device including a damascene structure manufactured according to the method recited in claim 12, and one or more further layers on the planarised surface.

* * * * *